(12) United States Patent  (10) Patent No.: US 9,407,264 B1
Ali et al.  (45) Date of Patent: Aug. 2, 2016

(54) SYSTEM FOR ISOLATING INTEGRATED CIRCUIT POWER DOMAINS

(71) Applicant: FREESCALE SEMICONDUCTOR, INC., Austin, TX (US)

(72) Inventors: Inayat Ali, Jabalpur (IN); Parul Sharma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/714,333

(22) Filed: May 17, 2015

(51) Int. Cl.
 *H03K 19/0175* (2006.01)
 *H03K 19/00* (2006.01)

(52) U.S. Cl.
 CPC .................................. *H03K 19/0016* (2013.01)

(58) Field of Classification Search
 None
 See application file for complete search history.

(56) References Cited

U.S. PATENT DOCUMENTS

| | | | |
|---|---|---|---|
| 6,950,951 B2* | 9/2005 | Flynn | G06F 1/24 323/299 |
| 7,167,017 B2 | 1/2007 | Arora | |
| 7,183,825 B2* | 2/2007 | Padhye | G11C 5/147 327/202 |
| 7,279,927 B2* | 10/2007 | Falkowski | H02J 1/14 326/112 |
| 7,992,024 B2 | 8/2011 | Islam et al. | |
| 8,020,017 B2* | 9/2011 | Padhye | G06F 1/3203 713/300 |
| 8,051,313 B2* | 11/2011 | Li | H03K 3/0375 326/21 |
| 8,183,713 B2* | 5/2012 | Rao | H03K 19/00361 307/38 |
| 8,347,130 B2* | 1/2013 | Park | G06F 1/3203 713/300 |
| 8,570,788 B2* | 10/2013 | Hess | G06F 1/3203 365/154 |
| 8,832,475 B1* | 9/2014 | Sheets | G06F 1/3287 712/228 |
| 9,172,358 B1* | 10/2015 | Wang | G01R 31/318536 |
| 2009/0204835 A1 | 8/2009 | Smith | |
| 2013/0140905 A1 | 6/2013 | Huang | |
| 2013/0238916 A1 | 9/2013 | Dohm | |

* cited by examiner

*Primary Examiner* — Alexander H Taningco
*Assistant Examiner* — Nelson Correa
(74) *Attorney, Agent, or Firm* — Charles E. Bergere

(57) ABSTRACT

A system for isolating a first power domain from a second power domain in an integrated circuit includes receiving an input signal from the first power domain and receiving a set of bits from a programmable register. An isolation enable signal indicative of isolating the first power domain from the second power domain is generated, and an intermediate signal based on the isolation enable signal and the input signal is generated. At least one of the input signal, a logic low signal, a logic high signal, and the intermediate signal is output based on the isolation enable signal and the set of bits.

20 Claims, 4 Drawing Sheets

SYSTEM FOR ISOLATING INTEGRATED CIRCUIT POWER DOMAINS

BACKGROUND

The present invention generally relates to integrated circuits having multiple power domains, and, more particularly, to a system for isolating power domains of an integrated circuit.

Integrated circuits (ICs) integrate various digital as well as analog circuits (hereinafter referred to as "functional blocks") on a single chip for performing various operations. The functional blocks include a large number of transistors. With advancements in semiconductor technology, the number of transistors is increasing continually, which results in increased power consumption.

Power consumption is a major concern, especially for handheld devices such as mobile phones, smart phones, laptops, cameras, personal digital assistants (PDAs), and tablets that are constrained due to limited energy available from batteries. Further, increases in the power consumption result in increases in the heat generated by the IC, which can adversely affect performance.

A known technique to reduce power consumption in an IC is to include one or more power management units, also referred to as power gating controllers, and define multiple power domains. An IC with multiple power domains also may be able to support several customer use-cases in which one or more power domains can be powered down on an as-needed basis. The IC also may be operable in multiple power modes, viz., high and low power modes. The high power mode is referred to as a high performance mode. A power domain that can be powered down when the functionality provided by the power domain is not required is referred to as a power-off domain. Generally, power domains that have high power consumption are power-off domains. Such power domains are operational when the IC is in the high power mode and powered down when the IC is in the low power mode. A power domain that is always powered up is referred to as a power-on domain. Generally, power domains that have low power consumption and perform essential functions are power-on domains. Such power domains are always operational, i.e., both when the IC is in high power mode and in the low power mode.

A power gating controller manages the power consumption of the IC by powering up and powering down the power domains of the IC based on a power mode. Each power domain includes one or more functional blocks. The IC includes different power supply rails for the power domains. The power supply rails provide voltages to the functional blocks of the power domains that are necessary for their operation. Switches such as such as bipolar junction transistors (BJTs) and metal-oxide semiconductor field effect transistors (MOSFETs) may be used to connect the high power supply rails to the functional blocks.

Power consumption is reduced by powering down one or more power domains when the functionality provided by those power domains is not required. The power gating controller provides power-down signals to the switches connecting the voltage rails to the functional blocks. The power-down signals are indicative of powering up or powering down corresponding power domains. For example, a switch is opened when the power gating controller wants to power down a corresponding power domain and the switch is closed when the power gating controller wants to power-up the domain.

However, when a power domain is powered down, an output signal from the power domain may be at neither logic high nor logic low such that another power domain that receives the signal may enter an unknown state, which may impair the operation of the IC.

One technique to overcome the aforementioned problem is to isolate a power domain that is connected to another power domain. FIG. 1 is a schematic block diagram of a conventional IC 100 that includes a power gating controller 102, a first power domain 104, an OR gate 106, a NOT gate 108, an AND gate 110, a latch 112, and a second power domain 114. The IC 100 is operable in low and high power modes.

The power gating controller 102 generates isolation enable, reset, and power-down signals ($V_{ISO\_EN}$, $V_R$, and $V_{PD}$, respectively). The isolation enable signal ($V_{ISO\_EN}$) is for isolating the second power domain 114 from the first power domain 104. The power gating controller 102 controls the power consumption of the IC 100 by controlling the isolation enable, reset, and power-down signals ($V_{ISO\_EN}$, $V_R$, and $V_{PD}$, respectively).

For example, the first power domain 104 can be powered down by the power gating controller 102 when the functionality provided by the first power domain 104 is not required. Thus, the first power domain 104 is operational when the IC 100 is in the high power mode and is powered down when the IC 100 is in the low power mode. The first power domain 104 is connected to the power gating controller 102 for receiving the reset and power-down signals ($V_R$ and $V_{PD}$). The first power domain 104 outputs first, second, and third output signals ($V_{OUT\_1}$, $V_{OUT\_2}$, and $V_{OUT\_3}$, respectively). The first, second, and third output signals ($V_{OUT\_1}$, $V_{OUT\_2}$, and $V_{OUT\_3}$) may be data signals, control signals, reset signals, handshaking signals, bit signals, etc. The first power domain 104 includes a first set of functional blocks (not shown) connected between first high and first low power supply rails (not shown). The IC 100 further includes a switch (not shown) that connects the first high power supply rail to the first set of functional blocks, i.e., the first power domain 104. The power gating controller 102 provides the power-down signal ($V_{PD}$) to the switch. The switch is opened when the power gating controller 102 enables the power-down signal ($V_{PD}$), thereby powering down the first power domain 104. The switch is closed when the power gating controller 102 disables the power-down signal ($V_{PD}$), thereby powering up the first power domain 104.

The OR gate 106 has first and second input terminals connected to the first power domain 104 and the power gating controller 102 for receiving the first output and isolation enable signals ($V_{OUT\_1}$ and $V_{ISO\_EN}$) and generates a first isolation signal ($V_{ISO\_1}$).

The AND gate 110 has a first input terminal connected to the first power domain 104 for receiving the second output signal ($V_{OUT\_2}$) and a second input terminal for receiving an inverted isolation enable signal ($V_{INV\_ISO\_EN}$) from the NOT gate 108, and outputs a second isolation signal ($V_{ISO\_2}$).

The latch 112 has an input terminal connected to the first power domain 104 for receiving the third output signal ($V_{OUT\_3}$) and an enable terminal for receiving the inverted isolation enable signal ($V_{INV\_ISO\_EN}$). The latch 112 outputs the third isolation signal ($V_{ISO\_3}$). The latch 112 is disabled when the isolation enable signal ($V_{ISO\_EN}$) is enabled. Thus, the latch 112 retains a sampled value of the third output signal ($V_{OUT\_3}$) when the isolation enable signal ($V_{ISO\_EN}$) is active. For a signal provided by the first power domain 104 to the second power domain 114, one of the OR gate 106, the AND gate 110, and the latch 112 is used to isolate the second power domain 114 from the first power domain 104.

The second power domain 114 is connected to the OR gate 106, the AND gate 110, and the latch 112 for receiving the first, second, and third isolation signals ($V_{ISO\_1}$, $V_{ISO\_2}$, and $V_{ISO\_3}$). The second power domain 114 includes a second set of functional blocks (not shown) connected between second high and second low power supply rails (not shown) that are required for the operation of the second set of functional blocks.

When the power gating controller 102 determines that the second power domain 114 is to be isolated from the first power domain 104, the power gating controller 102 enables the reset signal ($V_R$). Elements such as flip-flops and latches of the first power domain 104 enter a pre-determined state when the reset signal ($V_R$) is active. Thus, the first, second, and third output signals ($V_{OUT\_1}$, $V_{OUT\_2}$, and $V_{OUT\_3}$) enter a pre-determined state. Subsequently, the power gating controller 102 enables the isolation enable signal ($V_{ISO\_EN}$), which in this example is high active.

The OR gate 106 receives the isolation enable signal ($V_{ISO\_EN}$) and generates the first isolation signal ($V_{ISO\_1}$) at logic high state irrespective of the logic state of the first output signal ($V_{OUT\_1}$). The AND gate 110 receives the inverted isolation enable signal ($V_{INV\_ISO\_EN}$) at logic low state and generates the second isolation signal ($V_{ISO\_2}$) at logic low state irrespective of the logic state of the second output signal ($V_{OUT\_2}$). The latch 112 receives the inverted isolation enable signal ($V_{INV\_ISO\_EN}$) at logic low state and hence, is disabled. Thus, the latch 112 holds a sampled value of the third output signal ($V_{OUT\_3}$), so the third isolation signal ($V_{ISO\_3}$) is the latched third output signal ($V_{OUT\_3}$).

The second power domain 114 receives the first, second, and third isolation signals ($V_{ISO\_1}$, $V_{ISO\_2}$, and $V_{ISO\_3}$) at fixed logic states when the isolation enable signal ($V_{ISO\_EN}$) is active, so any changes in the first, second, and third output signals ($V_{OUT\_1}$, $V_{OUT\_2}$, and $V_{OUT\_3}$) do not affect the logic state of the first, second, and third isolation signals ($V_{ISO\_1}$, $V_{ISO\_2}$, and $V_{ISO\_3}$) and hence, the second power domain 114 is isolated from the first power domain 104. Thus, the OR gate 106, the AND gate 110, and the latch 112 isolate the second power domain 114 from the first power domain 104. The OR gate 106, the AND gate 110, and the latch 112 are also referred to as isolation circuits 106, 110, and 112, respectively.

After enabling the isolation enable signal ($V_{ISO\_EN}$), the power gating controller 102 enables and provides the power-down signal ($V_{PD}$) to the switch connecting the first high power supply rail to the first set of functional blocks, thereby opening the switch. Thus, the first power domain 104 is powered down.

When the power gating controller 102 determines that the first power domain 104 is to be powered up, the power gating controller 102 disables the power-down signal ($V_{PD}$), which closes the switch. Subsequently, the power gating controller 102 disables the isolation enable signal ($V_{ISO\_EN}$). After disabling the isolation enable signal ($V_{ISO\_EN}$), the power gating controller 102 disables the reset signal ($V_R$). Thus, the power gating controller 102 disables the power-down, isolation enable, and the reset signals ($V_{PD}$, $V_{ISO\_EN}$, and $V_R$, respectively) to powering up the first power domain 104.

However, when the power gating controller 102 enables the isolation enable signal ($V_{ISO\_EN}$), the OR gate 106, the AND gate 110, and the latch 112 generate the first, second, and third isolation signals ($V_{ISO\_1}$, $V_{ISO\_2}$, and $V_{ISO\_3}$, respectively). Therefore, it is not possible to change the logic state of the first, second, and third isolation signals as per requirement, after the IC 100 has been manufactured. Further, an IC design corresponding to the IC 100 is simulated to ensure that the correct isolation circuit is selected for each signal provided by the first power domain 104 to the second power domain 114, thereby is very time consuming. Also, there is a possibility of the wrong isolation circuits being selected. As a result, the operation of second power domain 114 may be hampered when the IC 100 is in the low power mode.

Therefore, it would be advantageous to have an isolation circuit that isolates a power domain from another power domain and enables selection of different configurations of the isolation circuit post-manufacturing.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
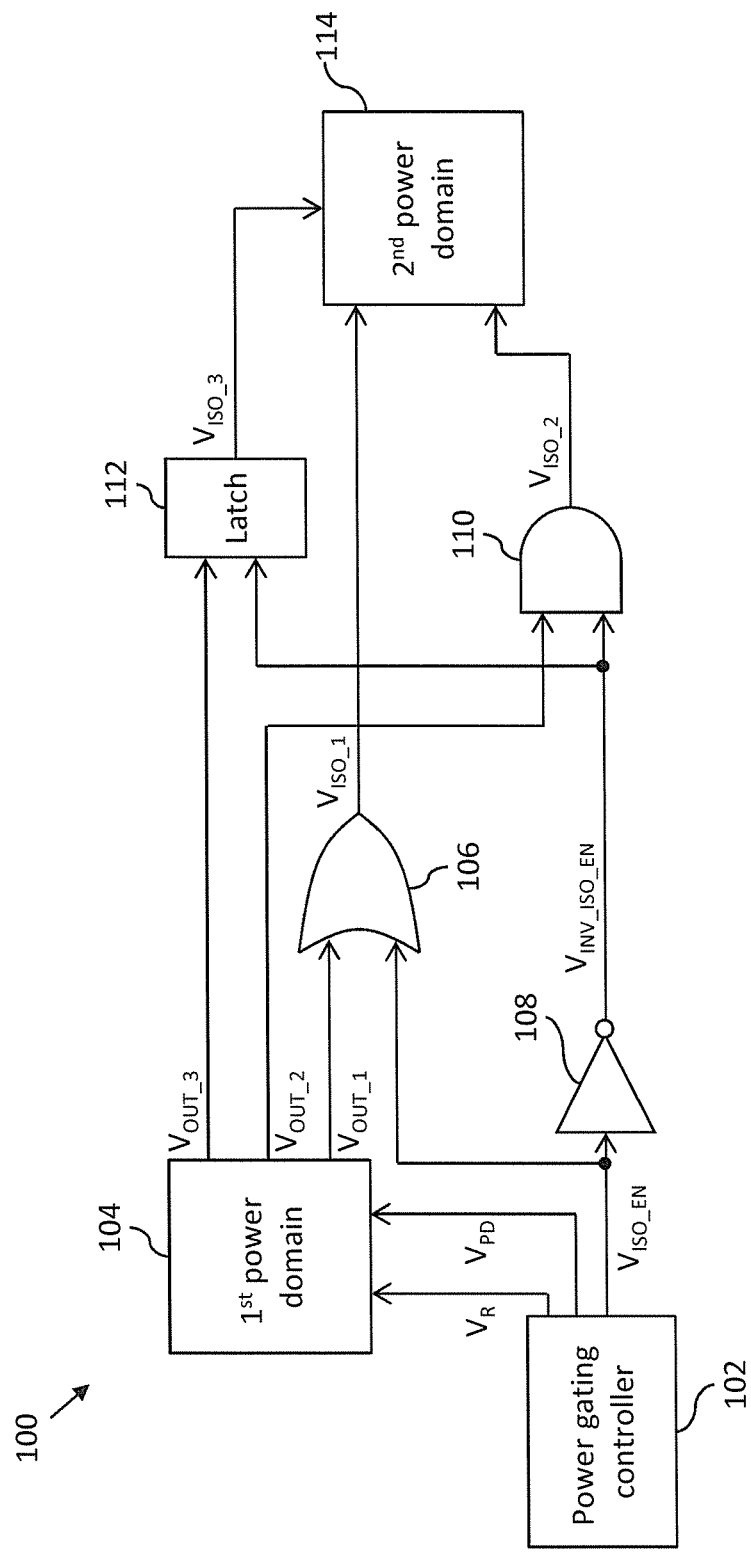
FIG. 1 is a schematic block diagram of a conventional integrated circuit having multiple power domains.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as mux and the term de-multiplexer has been abbreviated as demux.

In an embodiment of the present invention, a system for isolating a first power domain from a second power domain in an integrated circuit (IC) is provided. The system includes a first mux and an isolation circuit. The first mux has a first two-bit input terminal for receiving first and second bit signals, a second two-bit input terminal for receiving third and fourth bit signals, a select terminal for receiving an isolation enable signal, and a two-bit output terminal for outputting fifth and sixth bit signals. The isolation circuit includes a logic gate, a latch, and a second mux. The logic gate has first and second input terminals connected to the two-bit output terminal of the first mux for receiving the fifth and sixth bit signals, respectively, and an output terminal for generating an enable signal. The latch has a first input terminal for receiving an input signal, an enable terminal connected to the output terminal of the logic gate for receiving the enable signal, and an output terminal for outputting a latched signal. The second mux has first, second, and third input terminals for receiving the input signal, a logic low signal, and a logic high signal, respectively. The second mux also has a fourth input terminal connected to the output terminal of the latch for receiving the latched signal, a two-bit select terminal connected to the two-bit output terminal of the first mux for receiving the fifth and sixth bit signals, and an output terminal for outputting an isolation signal. The isolation circuit is configurable for outputting at least one of the input signal, the logic low signal, the logic high signal, and the latched signal as the isolation signal for isolating the first power domain from the second power domain based on the fifth and sixth bit signals.

In another embodiment of the present invention, a system for isolating a first power domain from a second power domain in an IC is provided. The first power domain outputs an input signal. The system includes a power gating control circuit and a mux. The power gating control circuit generates an isolation enable signal. The mux has a first input terminal for receiving a first bit signal that is configurable for selecting an isolation type. The mux has a second input terminal connected to the first power domain for receiving the input signal, a select terminal connected to the power gating control circuit for receiving the isolation enable signal, and an output terminal for outputting at least one of the input signal and the first bit signal as an isolation signal. The mux isolates the first power domain from the second power domain when the isolation enable signal is active, e.g., logic high.

In yet another embodiment of the present invention, a method for isolating a first power domain from a second power domain in an IC using an isolation circuit and a power gating control circuit is provided. The method includes receiving an input signal from the first power domain. The method further includes receiving a set of bit signals for selecting an isolation type of the isolation circuit. The isolation circuit is configurable as first and second isolation types based on the set of bit signals and the isolation enable signal. The method further includes receiving an isolation enable signal from the power gating control circuit. The isolation enable signal is indicative of isolating the first power domain from the second power domain. The method further includes generating an intermediate signal based on the input and isolation enable signals. The method further includes outputting the input signal to the second power domain when the isolation enable signal is disabled and outputting at least one of a logic high signal, a logic low signal, and the intermediate signal to the second power domain based on the set of bit signals when the isolation enable signal is enabled.

Various embodiments of the present invention provide a system and method for isolating a first power domain from a second power domain in an integrated circuit. The method includes receiving an input signal from the first power domain, a set of bit signals, and an isolation enable signal. An intermediate signal is generated based on the input and isolation enable signals. The input signal is provided to the second power domain when the isolation enable signal is disabled and at least one of a logic high signal, a logic low signal, and the intermediate signal is provided to the second power domain based on the set of bit signals when the isolation enable signal is enabled. The isolation enable signal is generated by a power gating control circuit. The intermediate signal is generated by a latch. At least one of the input signal, the logic low signal, the logic high signal, and the intermediate signal is provided to the second power domain by an isolation circuit based on the set of bit signals and the isolation enable signal. The set of bits are configurable for selecting an isolation type of the isolation circuit to output at least one of the input signal, the logic low signal, the logic high signal, and the intermediate signal to the second power domain. Hence, the logic state of the signal provided to the second power domain can be selected as per requirement even after the IC has been manufactured. It is not necessary to simulate an IC design for determining the correct isolation type of the isolation circuit, thereby reducing the number of engineering hours required for verification of the IC design.

Figure 2:
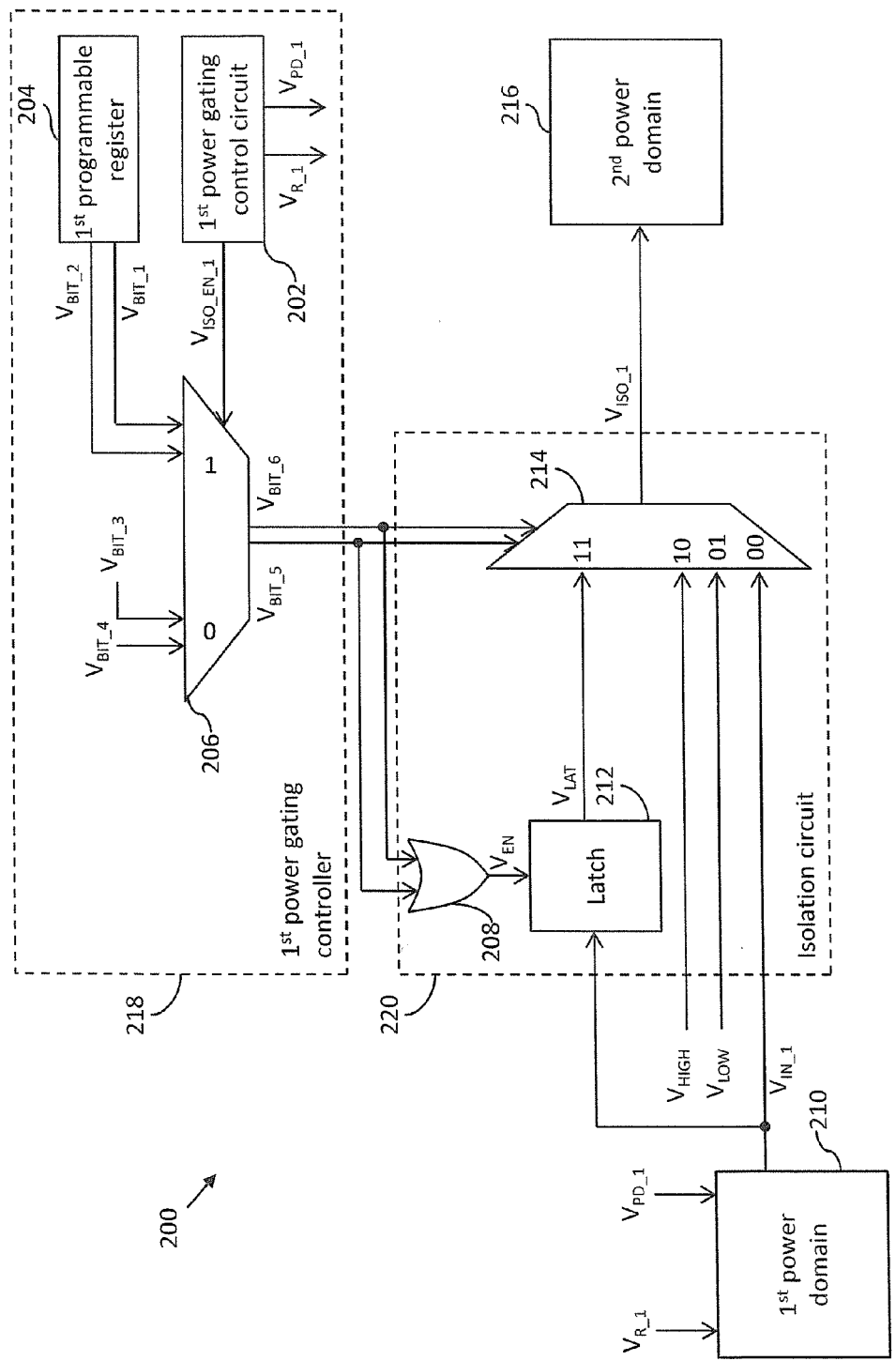
FIG. 2 is a schematic block diagram of an integrated circuit including first and second power domains in accordance with an embodiment of the present invention.

Referring now to FIG. 2, a schematic block diagram of an integrated circuit (IC) 200 in accordance with an embodiment of the present invention is shown. The IC 200 includes a first power gating control circuit 202, a first programmable register 204, a first mux 206, an OR gate 208, a first power domain 210, a latch 212, a second mux 214, and a second power domain 216. The IC 200 is operable in multiple power modes. For example, the IC 200 may be operable in low and high power modes. The high power mode is also referred to as a high performance mode.

The first power gating control circuit 202 generates a first isolation enable signal $V_{ISO\_EN\_1}$. The first isolation enable signal $V_{ISO\_EN\_1}$ is indicative of isolating the first power domain 210 from the second power domain 216 when the IC 200 transitions from the high power mode to the low power mode. In one embodiment, the first power gating control circuit 202 generates first reset and first power-down signals $V_{R\_1}$ and $V_{PD\_1}$. The first power-down signal $V_{PD\_1}$ is indicative of at least one of powering up and powering down the first power domain 210. The first power gating control circuit 202 enables the first power-down signal $V_{PD\_1}$ for powering down the first power domain 210 and disables the first power-down signal $V_{PD\_1}$ for powering up the first power domain 210. The first power gating control circuit 202 controls power consumption of the IC 200 by controlling the first isolation enable, first reset, and first power-down signals $V_{ISO\_EN\_1}$, $V_{R\_1}$, and $V_{PD\_1}$, respectively. The first power gating control circuit 202 generates the first isolation enable signal $V_{ISO\_EN\_1}$ at a logic high state to isolate the first power domain 210 from the second power domain 216, i.e., the first power gating control circuit 202 enables the first isolation enable signal $V_{ISO\_EN\_1}$ to isolate the first power domain 210 from the second power domain 216. When isolation is not required, the first power gating control circuit 202 generates the first isolation enable signal $V_{ISO\_EN\_1}$ at logic low state, which disables the first isolation enable signal $V_{ISO\_EN\_1}$. In one embodiment of the present invention, when the IC 200 is in the low power mode, the first power gating control circuit 202 determines that the first power domain 210 is not required for the operation of the IC 200, and powers down the first power domain 210. In another embodiment of the present invention, the second power domain 216 provides a signal indicative of powering down the first power domain 210 to the first power gating control circuit 202. In yet another embodiment of the present invention, a functional block such as analog and digital circuits in a third power domain (not shown) provides a signal indicative of powering down the first power domain 210 to the first power gating control circuit 202.

The first programmable register 204 stores first and second bits for outputting first and second bit signals $V_{BIT\_1}$ and $V_{BIT\_2}$, respectively.

The first mux 206 has a first two-bit input terminal connected to the first programmable register 204 for receiving the first and second bit signals $V_{BIT\_1}$ and $V_{BIT\_2}$ and a second two-bit input terminal for receiving third and fourth bit signals $V_{BIT\_3}$ and $V_{BIT\_4}$. The first mux 206 has a select terminal connected to the first power gating control circuit 202 for receiving the first isolation enable signal $V_{ISO\_EN\_1}$ and a two-bit output terminal for outputting fifth and sixth bit signals $V_{BIT\_5}$ and $V_{BIT\_6}$. In one embodiment, the third and fourth bit signals $V_{BIT\_3}$ and $V_{BIT\_4}$ are at logic low states and are provided by low power supply rails (not shown).

When the first power gating control circuit 202 disables the first isolation enable signal $V_{ISO\_EN\_1}$, the first mux 206 outputs the third and fourth bit signals $V_{BIT\_3}$ and $V_{BIT\_4}$ as the fifth and sixth bit signals $V_{BIT\_5}$ and $V_{BIT\_6}$. When the first power gating control circuit 202 enables the first isolation enable signal $V_{ISO\_EN\_1}$, the first mux 206 outputs the first and second bit signals $V_{BIT\_1}$ and $V_{BIT\_2}$ as the fifth and sixth bit signals $V_{BIT\_5}$ and $V_{BIT\_6}$.

The OR gate 208 has first and second input terminals connected to the two-bit output terminal of the first mux 206 for receiving the fifth and sixth bit signals $V_{BIT\_5}$ and $V_{BIT\_6}$, respectively. The OR gate 208 has an output terminal for generating an enable signal $V_{EN}$. The OR gate 208 generates the enable signal $V_{EN}$ at logic low state when the fifth and sixth bit signals $V_{BIT\_5}$ and $V_{BIT\_6}$ are low, i.e, when the first isolation enable signal $V_{ISO\_EN\_1}$ is disabled. The OR gate 208 generates the enable signal $V_{EN}$ at logic high state when the at least one of the fifth and sixth bit signals $V_{BIT\_5}$ and $V_{BIT\_6}$ is at high, i.e, when the first isolation enable signal $V_{ISO\_EN\_1}$ is active (enabled).

In one embodiment, the first power domain 210 can be powered down by the first power gating control circuit 202 when the functionality provided by the first power domain 210 is not required. Thus, the first power domain 210 is operational when the IC 200 is in the high power mode and is powered down when the IC 200 is in the low power mode. The first power domain 210 is connected to the first power gating control circuit 202 for receiving the first reset and first power-down signals $V_{R\_1}$ and $V_{PD\_1}$. The first power domain 210 outputs a first input signal $V_{IN\_1}$. Examples of the first input signal $V_{IN\_1}$ include a data signal, a control signal, a reset signal, a handshaking signal, and a bit signal from a register or a combination thereof. The first power domain 210 may include a first set of functional blocks (not shown) such as analog and digital circuits. The first set of functional blocks are connected between first high and first low power supply rails (not shown) that are required for the operation of the first set of functional blocks of the first power domain 210.

In an embodiment of the present invention, a switch connects the first high power supply rail to the first set of functional blocks. In another embodiment, the switch connects the first low power supply rail to the first set of functional blocks. The first power gating control circuit 202 provides the first power-down signal $V_{PD\_1}$ to the switch. The first power gating control circuit 202 enables and provides the first power-down signal $V_{PD\_1}$ to the switch when the first isolation enable signal $V_{ISO\_EN\_1}$ is high, i.e., when the second power domain 216 needs to be isolated from the first power domain 210. Thus, the first power domain 210 is powered down. The first power gating control circuit 202 disables the first power-down signal $V_{PD\_1}$ for powering up the first power domain 210.

It will be understood by those of skill in the art that the switch may be any power-gating circuit for receiving the first power-down signal $V_{PD\_1}$ from the first power gating control circuit 202 for powering up or powering down the first power domain 210. For example, the switches may be transistors such as bipolar junction transistors (BJTs) and metal-oxide semiconductor field effect transistors (MOSFETs).

It will be understood by those of skill in the art that the IC 200 may include a high power supply rail and a low power supply rail for all power domains contained in the IC 200 and switches for connecting the power supply rails to the corresponding power domains.

In one embodiment, the first power gating control circuit 202 and the first programmable register 204 form a first power gating controller 218. The first power gating controller 218 may further include the first mux 206, thereby reducing the number of wires or metal lines required for routing the first and second bit signals $V_{BIT\_1}$ and $V_{BIT\_2}$ from the first programmable register 204 to the first mux 206 and the first isolation enable signal $V_{ISO\_EN\_1}$ from the first power gating control circuit 202 to the first mux 206.

The latch 212 has an input terminal connected to the first power domain 210 for receiving the first input signal $V_{IN\_1}$ and an enable terminal connected to the output terminal of the OR gate 208 for receiving the enable signal $V_{EN}$. The latch 212 has an output terminal for outputting a latched signal $V_{LAT}$. The latch 212 may be a D latch, an SR latch, a JK latch or the like, or any other digital circuit that implements function of a latch. The latch 212 is disabled when the enable signal $V_{EN}$ is high, i.e., when the first isolation enable signal $V_{ISO\_EN\_1}$ is enabled. Thus, the latch 212 holds a sampled value of the first input signal $V_{IN\_1}$ and any change in the first input signal $V_{IN\_1}$ will not affect the logic state of the latched signal $V_{LAT}$ when the first isolation enable signal $V_{ISO\_EN\_1}$ is enabled.

The second mux 214 has a first input terminal connected to the first power domain 210 for receiving the first input signal $V_{IN\_1}$. The second mux 214 has second and third input terminals for receiving logic low and logic high signals $V_{LOW}$ and $V_{HIGH}$, respectively. The second mux 214 has a two-bit select terminal connected to the two-bit output terminal of the first mux 206 for receiving the fifth and sixth bit signals $V_{BIT\_5}$ and $V_{BIT\_6}$ and an output terminal for outputting a first isolation signal $V_{ISO\_1}$. In one embodiment, the logic low and logic high signals $V_{LOW}$ and $V_{HIGH}$ are provided by the low power supply rail and the high power supply rail respectively.

The second power domain 216 is connected to the output terminal of the second mux 214 for receiving the first isolation signal $V_{ISO\_1}$. The second power domain 216 may include a second set of functional blocks (not shown) such as analog and digital circuits. The second set of functional blocks are connected between second high and second low power supply rails (not shown) that are required for the operation of the second set of functional blocks.

In one embodiment of the present invention, the OR gate 208, the latch 212, and the second mux 214 form an isolation circuit 220. It will be understood by those of skill in the art that the isolation circuit 220 may be a part of the second power domain 216 or another power domain. As the first power domain 210 can be powered down, it is preferred that the isolation circuit 220 is not included in the first power domain 210.

The isolation circuit 220 is configurable as one of first, second, and third isolation types based on the fifth and sixth bit signals $V_{BIT\_5}$ and $V_{BIT\_6}$ and the first isolation enable signal $V_{ISO\_EN\_1}$. As the first mux 206 outputs the first and second bit signals $V_{BIT\_1}$ and $V_{BIT\_2}$ as the fifth and sixth bit signals $V_{BIT\_5}$ and $V_{BIT\_6}$, respectively, the isolation circuit 220 can be configured as one of the first, second, and third isolation types based on the first and second bit signals $V_{BIT\_1}$ and $V_{BIT\_2}$. The first and second bits of the first programmable register 204 are configurable by a processor, a register, a configuration circuit, external pins, electrically programmable fuses, or combinations thereof. It will be understood by those of skilled in the art that the first and second bits of the first programmable register 204 could also be programmed by other sources. For example, an operator may configure the first and second bits of the first programmable register 204 using a processor in order to select an isolation type of the isolation circuit 220.

The isolation circuit 220 outputs the first input signal $V_{IN\_1}$) as the first isolation signal $V_{ISO\_1}$ when the fifth and sixth bit signals $V_{BIT\_5}$ and $V_{BIT\_6}$ are low, i.e., when the first isolation enable signal $V_{ISO\_EN\_1}$ is low. The isolation circuit 220 is configured as the first isolation type for outputting the logic low signal $V_{LOW}$ as the first isolation signal $V_{ISO\_1}$ when the fifth and sixth bit signals $V_{BIT\_5}$ and $V_{BIT\_6}$ are at logic low and logic high states, respectively, i.e., when the first isolation enable signal $V_{ISO\_EN\_1}$ is enabled and the first and second bit signals $V_{BIT\_1}$ and $V_{BIT\_2}$ are at logic low and logic high states, respectively. As the isolation circuit 220 outputs the logic low signal $V_{LOW}$ as the first isolation signal $V_{ISO\_1}$ when the isolation circuit 220 is configured as the first isolation type, the first isolation type is also referred to as a first isolation type zero. The isolation circuit 220 is configured as the second isolation type for outputting the logic high signal $V_{HIGH}$ as the first isolation signal $V_{ISO\_1}$ when the fifth and sixth bit signals $V_{BIT\_5}$ and $V_{BIT\_6}$ are at logic high and logic low states, respectively, i.e., when the first isolation enable signal $V_{ISO\_EN\_1}$ is enabled and the first and second bit signals $V_{BIT\_1}$ and $V_{BIT\_2}$ are at logic high and logic low states, respectively. As the isolation circuit 220 outputs the logic high signal $V_{HIGH}$ as the first isolation signal $V_{ISO\_1}$ when the isolation circuit 220 is configured as the second isolation type, the second isolation type is also referred to as a first isolation type one. The isolation circuit 220 is configured as the third isolation type for outputting the latched signal $V_{LAT}$ as the first isolation signal $V_{ISO\_1}$ when the fifth and sixth bit signals $V_{BIT\_5}$ and $V_{BIT\_6}$ are high, i.e., when the first isolation enable signal $V_{ISO\_EN\_1}$ is active (enabled) and the first and second bit signals $V_{BIT\_5}$ and $V_{BIT\_6}$ are high. As the isolation circuit 220 outputs the latched signal $V_{LAT}$ as the first isolation signal $V_{ISO\_1}$ when the isolation circuit 220 is configured as the third isolation type, the first isolation type is also referred to as an isolation type hold.

In one embodiment, the first and second bits of the first programmable register 204 are configured by a processor to store logic zero and logic one values, respectively. Hence, the first programmable register 204 outputs the first and second bit signals $V_{BIT\_1}$ and $V_{BIT\_2}$ at logic low and logic high states, respectively. The first isolation enable signal $V_{ISO\_EN\_1}$ is low and hence, the first power domain 210 is not isolated from the second power domain 216. A switch connects the first low power supply rail to the first set of functional blocks. The first power gating control circuit 202 determines that the first power domain 210 has to be powered down. The first power gating control circuit 202 enables the first isolation enable signal $V_{ISO\_EN\_1}$. The first mux 206 outputs the fifth and sixth bit signals $V_{BIT\_5}$ and $V_{BIT\_6}$ at logic low and logic high states, respectively, thereby configuring the isolation circuit 220 as the first isolation type for outputting and providing the logic low signal $V_{LOW}$ as the first isolation signal $V_{ISO\_1}$ to the second power domain 216. Any change in the first input signal $V_{IN\_1}$ will not affect the logic state of the first isolation signal $V_{ISO\_1}$ and hence, the second power domain 216 is isolated from the first power domain 210. Subsequently, the first power gating control circuit 202 enables and provides the first power-down signal $V_{PD\_1}$ to the switch, thereby opening the switch and thus, powering down the first power domain 210. The processor may configure the first and second bits of the first programmable register 204 to select one of first, second, and third isolation types prior to enabling of the first isolation enable signal $V_{ISO\_EN\_1}$ by the first power gating control circuit 202.

When the first power gating control circuit 202 determines that the first power domain 210 has to be powered up, the first power gating control circuit 202 enables the first reset signal $V_{R\_1}$ to reset the first set of functional blocks to an initial state. Subsequently, the first power gating control circuit 202 disables the first power-down signal $V_{PD\_1}$, i.e., the first power gating control circuit 202 disables the first power-down signal $V_{PD\_1}$, thereby closing the switch. Thus, the first power domain 210 is powered up. After powering up the first power domain 210, the first power gating control circuit 202 disables the first reset signal $V_{R\_1}$. Subsequently, the first power gating control circuit 202 disables the first isolation enable signal $V_{ISO\_EN\_1}$ and hence, the isolation circuit 220 provides the first input signal $V_{IN\_1}$ to the second power domain 216. For example, the first power gating control circuit 202 may disable the first isolation enable signal ($V_{ISO\_EN\_1}$) prior to disabling the first reset signal ($V_{R\_1}$).

In another embodiment, the isolation circuit 220 is configured as the second isolation type for outputting the logic high signal $V_{HIGH}$ as the first isolation signal $V_{ISO\_1}$ when the first and second bits of the first programmable register 204 are configured by the processor for storing logic one and logic zero values, respectively.

In yet another embodiment, the isolation circuit 220 is configured as the third isolation type to output the latched signal $V_{LAT}$ as the first isolation signal $V_{ISO\_1}$ when the first and second bits of the first programmable register 204 are configured by the processor for storing logic one values.

Thus, the first and second bits of the first programmable register 204 can be configured for selecting one of the first, second, and third isolation types of the isolation circuit 220 even after the IC 200 has been manufactured. Hence, the engineering hours required for simulating and verifying an IC design corresponding to the IC 200 are reduced. Hence, the cost of design, manufacture and testing the IC 200 is reduced by minimizing the verification effort.

Figure 3:
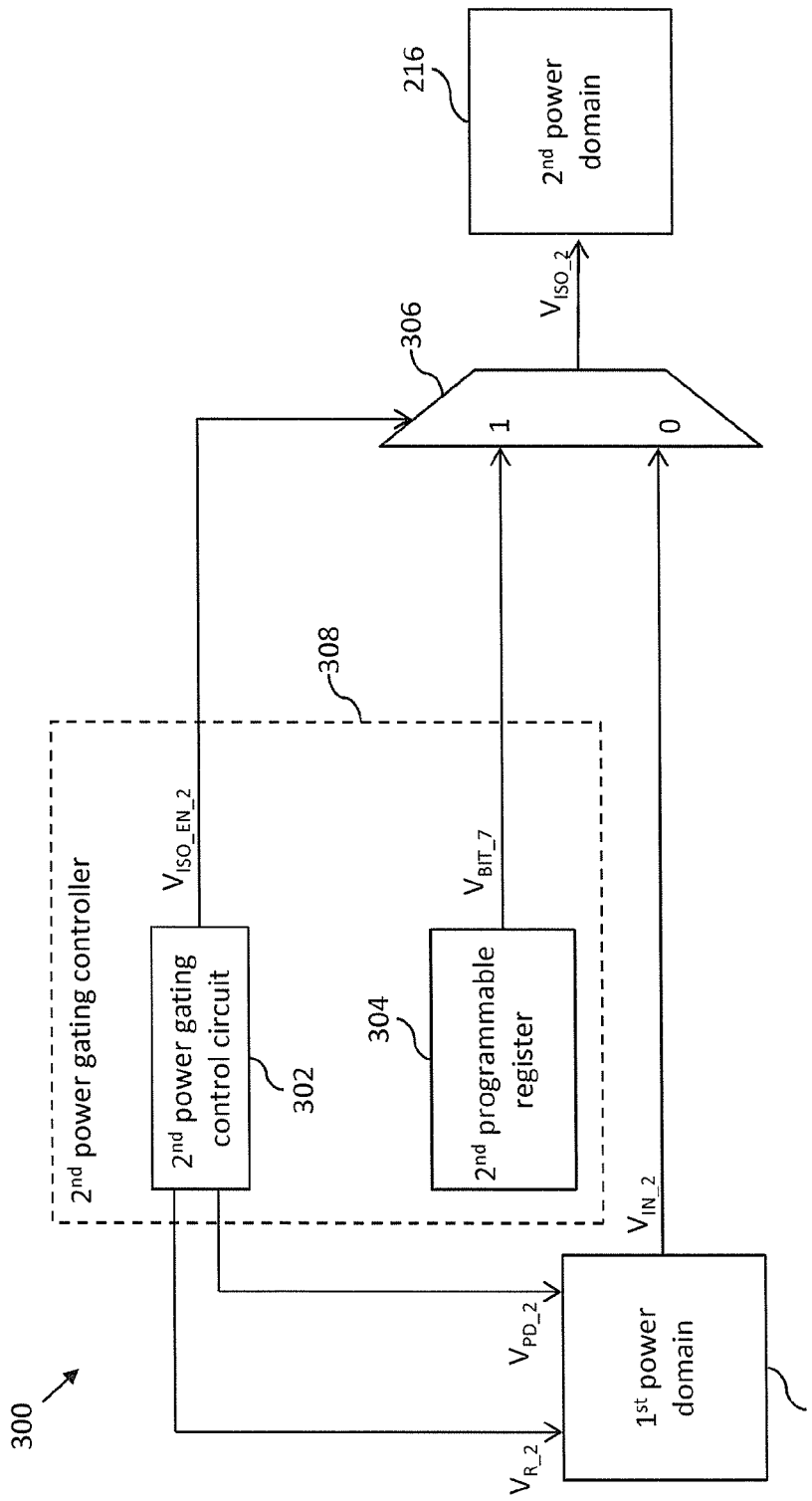
FIG. 3 is a schematic block diagram of another integrated circuit in accordance with an embodiment of the present invention.

Referring now to FIG. 3, a schematic block diagram of another IC 300 in accordance with another embodiment of the present invention is shown. The IC 300 includes the first and second power domains 210 and 216. The IC 300 further includes a second power gating control circuit 302, a second programmable register 304, and a third mux 306. The IC 300 is operable in multiple power modes. For example, the IC 300 may be operable in low and high power modes.

The first power domain 210 outputs a second signal $V_{IN\_2}$. Examples of the second input signal $V_{IN\_2}$ include a data signal, a control signal, a reset signal, a handshaking signal, and a bit signal from a register or a combination thereof.

The second power gating control circuit 302 generates a second isolation enable signal $V_{ISO\_EN\_2}$. The second isolation enable signal $V_{ISO\_EN\_2}$ is used to isolate the first power domain 210 from the second power domain 216 when the IC 300 transitions from the high power mode to the low power mode. In an example, the second power gating control circuit 302 generates second reset and second power-down signals ($V_{R\_2}$ and $V_{PD\_2}$). The second power-down signal $V_{PD\_2}$ is indicative of at least one of powering up and powering down the first power domain 210. The second power gating control circuit 302 enables the second power-down signal $V_{PD\_2}$ for powering down the first power domain 210 and disables the second power-down signal $V_{PD\_2}$ for powering up the first power domain 210. The second power gating control circuit 302 controls power consumption of the IC 300 by controlling the second isolation enable, second reset, and second power-down signals $V_{ISO\_EN\_2}$, $V_{R\_2}$, and $V_{PD\_2}$, respectively. The second power gating control circuit 302 generates the second isolation enable signal $V_{ISO\_EN\_2}$ at logic high state for isolating the first power domain 210 from the second power domain 216, i.e., the second power gating control circuit 302 enables the second isolation enable signal $V_{ISO\_EN\_2}$ for isolating the first power domain 210 from the second power domain 216. The second power gating control circuit 302 generates the second isolation enable signal $V_{ISO\_EN\_2}$ at logic low state to turn off (disable) the second isolation enable signal $V_{ISO\_EN\_2}$.

In an embodiment of the present invention, the second power gating control circuit 302 determines that the first power domain 210 is not required for the operation of the IC 300 and hence, needs may be powered down. In another embodiment, the second power domain 216 provides a signal indicative of powering down the first power domain 210 to the second power gating control circuit 302. In yet another embodiment, a functional block such as analog and digital circuits in a fourth power domain (not shown) provides a signal indicative of powering down the first power domain 210 to the second power gating control circuit 302. The second programmable register 304 stores a first bit for outputting a seventh bit signal $V_{BIT\_7}$. In an example, the second power gating control circuit 302 and the second programmable register 304 form a second power gating controller 308.

The third mux 306 has first and second input terminals connected to the first power domain 210 and the second programmable register 304 for receiving the second input signal $V_{IN\_2}$ and the seventh bit signal $V_{BIT\_7}$. The third mux 306 has a select terminal for receiving the second isolation enable signal $V_{ISO\_EN\_2}$ and an output terminal for outputting a second isolation signal $V_{ISO\_2}$. The third mux 306 is configurable as fourth and fifth isolation types based on the seventh bit signal $V_{BIT\_7}$ and the second isolation enable signal $V_{ISO\_EN\_2}$. The first bit of the second programmable register 304 is configurable by at least one of a processor, a register, a configuration circuit, external pins, and electrically programmable fuses, or a combination thereof. It will be understood by those of skill in the art that the first bit of the second programmable register 304 can be programmed by other sources and hence, will lie under the scope of the invention. It will be understood by those of skill in the art that the third mux 306 can be part of the second power domain 216 or another power domain. As the first power domain 210 can be powered down, it will be understood by those of skill in the art that the third mux 306 preferably is not included in the first power domain 210.

The third mux 306 outputs the second input signal $V_{IN\_2}$ as the second isolation signal $V_{ISO\_2}$ when the second isolation enable signal $V_{ISO\_EN\_2}$ is disabled. The third mux 306 is configured as the fourth isolation type for outputting the second isolation signal $V_{ISO\_2}$ at logic low state to the second power domain 216 when the second isolation enable signal $V_{ISO\_EN\_2}$ is enabled and the seventh bit signal $V_{BIT\_7}$ is at logic low state. As the third mux 306 outputs the second isolation signal $V_{ISO\_2}$ at logic low state when the third mux 306 is configured as the fourth isolation type, the fourth isolation type is also referred to as a second isolation type zero. The third mux 306 is configured as the fifth isolation type for outputting the second isolation signal $V_{ISO\_2}$ at logic high state when the second isolation enable signal $V_{ISO\_EN\_2}$ is enabled and the seventh bit signal $V_{BIT\_7}$ is high. As the third mux 306 outputs the second isolation signal $V_{ISO\_2}$ at logic high state when the third mux 306 is configured as the fifth isolation type, the fifth isolation type is also referred to as a second isolation type one.

In one embodiment, the first bit of the second programmable register 304 is configured by a processor to store a logic zero value. Thus, the second programmable register 304 outputs the seventh bit signal $V_{BIT\_7}$ at logic low state. The second isolation enable signal $V_{ISO\_EN\_2}$ is low. A switch connects the first low power supply rail to the first set of functional blocks. The second power gating control circuit 302 determines that the first power domain 210 is to be powered down. The second power gating control circuit 302 enables the second isolation enable signal $V_{ISO\_EN\_2}$. As the second isolation enable signal $V_{ISO\_EN\_2}$ is enabled and the seventh bit signal $V_{BIT\_7}$ is low, the third mux 306 is configured as the fourth isolation type to output and provide the second isolation signal $V_{ISO\_2}$ at logic low state to the second power domain 216. Any change in the second input signal $V_{IN\_2}$ will not affect the logic state of the second isolation signal $V_{ISO\_2}$ and hence, the second power domain 216 is isolated from the first power domain 210. Subsequently, the second power gating control circuit 302 enables the second power-down signal $V_{PD\_2}$, thereby opening the switch. Thus, the first power domain 210 is powered down. The processor may configure the first bit of the second programmable register 304 to select one of the fourth and fifth isolation types prior to the enabling of the second isolation enable signal $V_{ISO\_EN\_2}$ by the second power gating circuit 302.

When the second power gating control circuit 302 determines that the first power domain 210 is to be powered up, the second power gating control circuit 302 enables the second reset signal $V_{R\_2}$ to reset the first set of functional blocks to an initial state. Subsequently, the second power gating control circuit 302 disables the second power-down signal $V_{PD\_2}$, thereby closing the switch. Thus, the first power domain 210 is powered up. After powering up the first power domain 210, the second power gating control circuit 302 disables the second reset signal $V_{R\_2}$. Subsequently, the second power gating control circuit 302 disables the second isolation enable signal $V_{ISO\_EN\_2}$ and hence, the third mux 306 outputs and provides the second input signal $V_{IN\_2}$ to the second power domain 216. In another embodiment of the present invention, the second power gating control circuit 302 disables the second isolation enable signal $V_{ISO\_EN\_2}$ before disabling the second reset signal $V_{R\_2}$.

In another example, the third mux 306 may be configured as the fifth isolation type for outputting the second isolation signal $V_{ISO\_2}$ (high active) when the first bit of the second programmable register 304 is programmed to store a logic one value.

Thus, the first bit of the second programmable register 304 can be configured to select one of the fourth and fifth isolation types of the third mux 306 even after the IC 300 has been manufactured. Hence, the engineering hours required for simulating and verifying an IC design are reduced, which can improve time-to-market. Further, the second isolation signal $V_{ISO\_2}$ provided to the second power domain 216 can be changed.

It will be understood by those of skill in the art that the IC 300 may include a high power supply rail and a low power supply rail for all power domains contained in the IC 300 and switches for connecting the power supply rails to the corresponding power domains.

Figure 4:
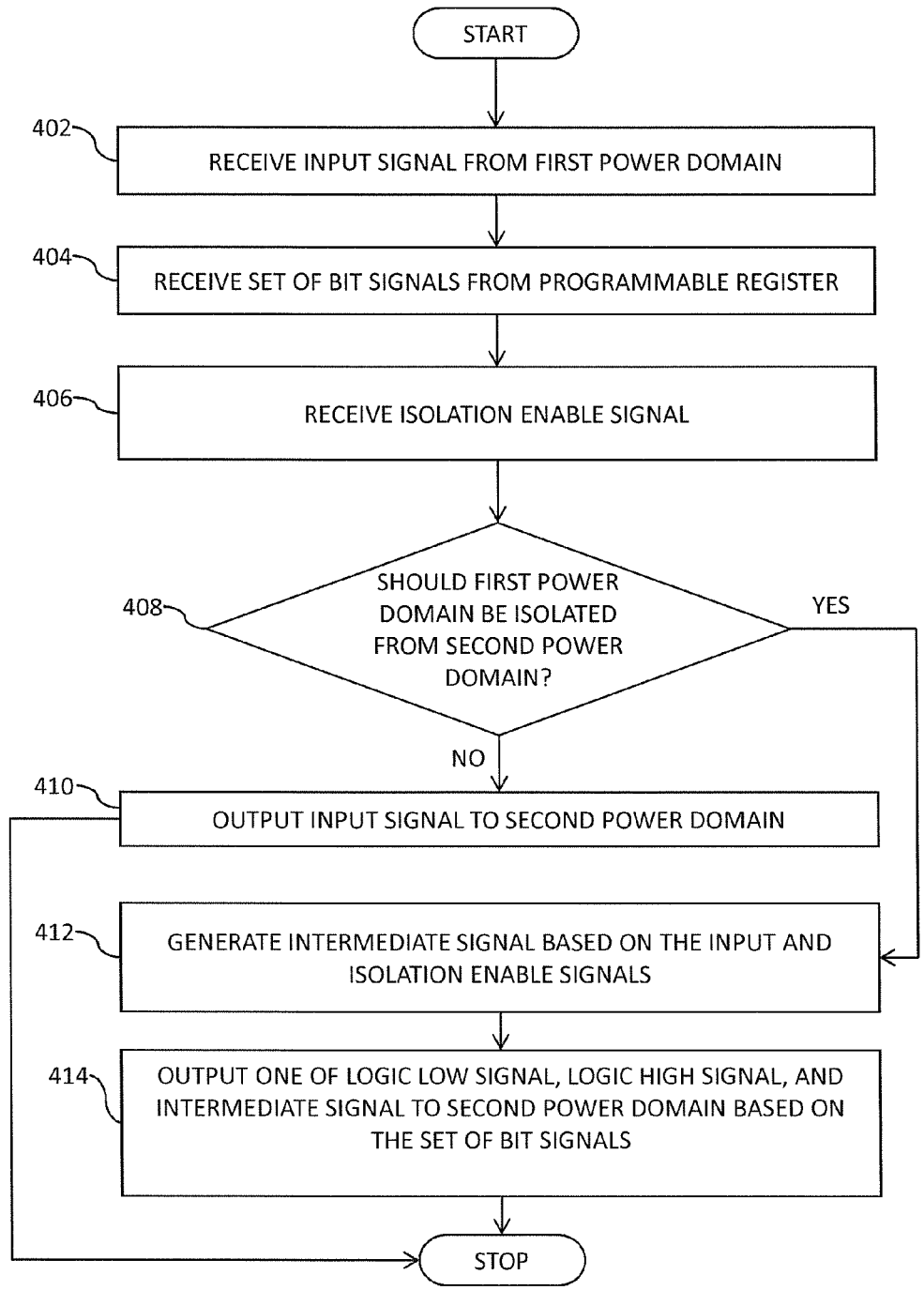
FIG. 4 is a flow chart illustrating a method for isolating the first power domain from the second power domain in the integrated circuit of FIG. 2 in accordance with an embodiment of the present invention.

Referring now to FIG. 4, a flow chart illustrating a method for isolating the first power domain 210 from the second power domain 216 using the isolation circuit 220 and the first power gating control circuit 202 in accordance with an embodiment of the present invention is shown. FIG. 4 is explained in conjunction with the IC 200 of FIG. 2.

At step 402, the first input signal ($V_{IN\_1}$) from the first power domain 210 is received by the second mux 214. At step 404, a set of bit signals, i.e., the first and second bit signals $V_{BIT\_1}$ and $V_{BIT\_2}$ are received by the first mux 206 from the first programmable register 204. The fifth and sixth bit signals $V_{BIT\_5}$ and $V_{BIT\_6}$ are output by the first mux 206. At step 406, the first isolation enable signal $V_{ISO\_EN\_1}$ is received by the first mux 206 from the first power gating control circuit 202. The first isolation enable signal $V_{ISO\_EN\_1}$ is indicative of isolating the first power domain 210 from the second power domain 216 when the IC 200 transitions from the high power mode to the low power mode. At step 408, a check is performed by the first power gating control circuit 202 to determine whether the first power domain 210 must be isolated from the second power domain 216. If at step 408, it is determined by the first power gating control circuit 202 that the first power domain 210 needs to be isolated from the second power domain 216, step 412 is performed. At step 410, the first input signal $V_{IN\_1}$ is provided by the isolation circuit 220 to the second power domain 216. At step 412, an intermediate signal, i.e., the latched signal $V_{LAT}$, is generated by the latch 212 based on the first input signal $V_{IN\_1}$ and the first isolation enable signal $V_{ISO\_EN\_1}$. At step 414, at least one of the logic low signal ($V_{LOW}$), the logic high signal ($V_{HIGH}$), and the latched signal ($V_{LAT}$) is provided by the isolation circuit 220 to the second power domain 216 based on the first and second bit signals $V_{BIT\_1}$ and $V_{BIT\_2}$.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention. No element, act, or instruction used in the present application should be construed as critical or essential to the invention unless explicitly described as such. Further, the phrase "based on" is intended to mean "based, at least in part, on" unless explicitly stated otherwise.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for isolating a first power domain of an integrated circuit (IC) from a second power domain of the IC, the system comprising:
a first multiplexer having a first two-bit input terminal for receiving first and second bit signals, a second two-bit input terminal for receiving third and fourth bit signals, a select terminal for receiving an isolation enable signal, and a two-bit output terminal for outputting fifth and sixth bit signals; and
an isolation circuit, comprising:
a logic gate connected to the two-bit output terminal of the first multiplexer for receiving the fifth and sixth bit signals, and for generating an enable signal;
a latch having a first input terminal for receiving an input signal, an enable terminal connected to the logic gate for receiving the enable signal, and an output terminal for outputting a latched signal; and
a second multiplexer having a first input terminal for receiving the input signal, a second input terminal for receiving a logic low signal, a third input terminal for receiving a logic high signal, a fourth input terminal connected to the latch for receiving the latched signal, a two-bit select terminal connected to the first multiplexer for receiving the fifth and sixth bit signals, and an output terminal for outputting an isolation signal,
wherein the isolation circuit is configurable for outputting at least one of the input signal, the logic low signal, the logic high signal, and the latched signal as the isolation signal for isolating the first power domain from the second power domain based on the fifth and sixth bit signals.

2. The system of claim 1, wherein the fifth and sixth bit signals are at logic low states when the isolation enable signal is at a logic low state and the third and fourth bit signals are at logic low states.

3. The system of claim 2, wherein the isolation circuit outputs the isolation signal as the input signal when the fifth and sixth bit signals are at logic low states.

4. The system of claim 1, wherein:
the fifth and sixth bit signals are at logic low and logic high states, respectively, when the isolation enable signal is high and the first and second bit signals are at logic low and logic high states, respectively,
the fifth and sixth bit signals are at logic high and logic low states, respectively, when the isolation enable signal is high and the first and second bit signals are at logic high and logic low states, respectively, and
the fifth and sixth bit signals are at logic high states when the isolation enable signal is high and the first and second bit signals are high.

5. The system of claim 4, wherein:
the isolation circuit outputs the logic low signal as the isolation signal when the fifth and sixth bit signals are at logic low and logic high states, respectively, and
the isolation circuit provides the logic low signal to the second power domain for isolating the first power domain from the second power domain.

6. The system of claim 4, wherein:
the isolation circuit outputs the logic high signal as the isolation signal when the fifth and sixth bit signals are at logic high and logic low states, respectively, and
the isolation circuit provides the logic high signal to the second power domain for isolating the first power domain from the second power domain.

7. The system of claim 4, wherein:
the isolation circuit outputs the latched signal as the isolation signal when the fifth and sixth bit signals are high, and
the isolation circuit provides the latched signal to the second power domain for isolating the first power domain from the second power domain.

8. The system of claim 1, further comprising a programmable register for storing first and second bits, and outputting the first and second bit signals corresponding to the first and second bits, respectively, wherein the first and second bits are configurable for selecting an isolation type of the isolation circuit.

9. The system of claim 8, further comprising a power gating control circuit for generating the isolation enable signal.

10. The system of claim 9, wherein the power gating control circuit, the programmable register, and the first multiplexer form a power gating controller.

11. The system of claim 1, wherein the first and second bit signals are configurable by at least one of a configuration circuit, an external pin, and an electrically programmable fuse.

12. A system for isolating a first power domain of an integrated circuit from a second power domain of the integrated circuit, wherein the first power domain outputs an input signal, the system comprising:
a power gating control circuit for generating an isolation enable signal; and
a multiplexer having a first input terminal for receiving a first bit signal that is configurable for selecting an isolation type, a second input terminal connected to the first power domain for receiving the input signal, a select terminal connected to the power gating control circuit for receiving the isolation enable signal, and an output terminal for outputting at least one of the input signal and the first bit signal as an isolation signal, wherein the multiplexer isolates the first power domain from the second power domain when the isolation enable signal is at a logic high state.

13. The system of claim 12, wherein:

the multiplexer provides a logic high signal as the isolation signal to the second power domain for isolating the first power domain from the second power domain when the first bit signal is high and the isolation enable signal is high, and the multiplexer provides a logic low signal as the isolation signal to the second power domain for isolating the first power domain from the second power domain when the first bit signal is low and the isolation enable signal is high.

14. The system of claim 12, further comprising a programmable register for storing a first bit and outputting the first bit signal corresponding to the first bit, wherein the first bit is configurable, and wherein the power gating control circuit and the programmable register form a power gating controller.

15. The system of claim 12, wherein the first bit signal is configurable by at least one of a configuration circuit, an external pin, and an electrically programmable fuse.

16. A method for isolating a first power domain of an integrated circuit from a second power domain of the integrated circuit using an isolation circuit and a power gating control circuit, the method comprising:

receiving an input signal from the first power domain;

receiving a set of bit signals for selecting an isolation type of the isolation circuit, wherein the isolation circuit is configurable as first and second isolation types based on the set of bit signals and an isolation enable signal;

receiving the isolation enable signal from the power gating control circuit, wherein the isolation enable signal is indicative of isolating the first power domain from the second power domain;

generating an intermediate signal based on the input signal and the isolation enable signal;

outputting the input signal to the second power domain when the isolation enable signal is disabled; and outputting at least one of a logic high signal, a logic low signal, and the intermediate signal to the second power domain based on the set of bit signals when the isolation enable signal is enabled.

17. The method of claim 16, wherein the logic low signal is provided to the second power domain when the isolation circuit is configured as the first isolation type, and wherein the logic high signal is provided to the second power domain when the isolation circuit is configured as the second isolation type, thereby isolating the first power domain from the second power domain.

18. The method of claim 17, wherein the intermediate signal is provided to the second power domain when the isolation circuit is configured as a third isolation type, thereby isolating the first power domain from the second power domain.

19. The method of claim 17, wherein the intermediate signal is generated by a latch that receives the input signal and the isolation enable signal, wherein a value of the input signal is latched and output as the intermediate signal when the isolation enable signal is enabled, and wherein the value of the intermediate signal is retained until the isolation enable signal is disabled.

20. The method of claim 17, wherein the set of bit signals are configurable by at least one of a configuration circuit, an external pin, an electrically programmable fuse, and a set of bits corresponding to the set of bit signals stored in a programmable register.

\* \* \* \* \*